United States Patent
Mitra et al.

(10) Patent No.: US 11,762,285 B2
(45) Date of Patent: Sep. 19, 2023

(54) TEMPLATE, PATTERNING METHOD, AND METHOD FOR MANUFACTURING SEMICONDUCTOR DEVICE

(71) Applicant: KIOXIA CORPORATION, Tokyo (JP)

(72) Inventors: Anupam Mitra, Yokohama Kanagawa (JP); Masaki Mitsuyasu, Kamakura Kanagawa (JP); Kazuya Fukuhara, Suginami Tokyo (JP); Kazuhiro Takahata, Yokohama Kanagawa (JP); Sachiko Kobayashi, Ota Tokyo (JP)

(73) Assignee: Kioxia Corporation, Tokyo (JP)

( * ) Notice: Subject to any disclaimer, the term of this patent is extended or adjusted under 35 U.S.C. 154(b) by 81 days.

(21) Appl. No.: 17/010,350

(22) Filed: Sep. 2, 2020

(65) Prior Publication Data

US 2021/0294208 A1  Sep. 23, 2021

(30) Foreign Application Priority Data

Mar. 18, 2020 (JP) .................................. 2020-048142

(51) Int. Cl.
| | |
|---|---|
| *G03F 7/00* | (2006.01) |
| *G03F 7/20* | (2006.01) |
| *H01L 21/027* | (2006.01) |
| *G03F 9/00* | (2006.01) |
| *B29C 59/02* | (2006.01) |
| *B29C 35/08* | (2006.01) |
| *B82Y 10/00* | (2011.01) |
| *B29C 33/00* | (2006.01) |

(52) U.S. Cl.
CPC ........ *G03F 7/0002* (2013.01); *B29C 35/0805* (2013.01); *B29C 59/02* (2013.01); *G03F 7/0017* (2013.01); *G03F 7/70625* (2013.01); *G03F 9/7042* (2013.01); *H01L 21/0277* (2013.01); *B29C 2033/0005* (2013.01); *B29C 2035/0827* (2013.01); *B82Y 10/00* (2013.01)

(58) Field of Classification Search
None
See application file for complete search history.

(56) References Cited

U.S. PATENT DOCUMENTS

| | | |
|---|---|---|
| 8,038,431 B2 | 10/2011 | Sano et al. |
| 2015/0158240 A1 | 6/2015 | Haase et al. |
| 2019/0086798 A1 | 3/2019 | Nagai et al. |

FOREIGN PATENT DOCUMENTS

| | | |
|---|---|---|
| JP | 2017504961 A | 2/2017 |
| JP | 2018014483 A | 1/2018 |
| JP | 5257225 B2 | 4/2018 |
| JP | 2018056545 A | 4/2018 |

*Primary Examiner* — Robert J Grun
(74) *Attorney, Agent, or Firm* — Kim & Stewart LLP

(57) ABSTRACT

According to one embodiment, an imprint lithography template comprises a substrate transparent to ultraviolet light. A first mesa region is on the substrate. A surface of the first mesa region includes a pattern region to be pressed into a photocurable resist film. The pattern region having four sides. A second mesa region is also on the substrate. The first mesa region protrudes from a surface of the second mesa region. A blocking film is adjacent to two sides of the four sides pattern region. The two sides to which the blocking film is adjacent are connected to each other at a corner of the pattern region. The blocking film blocks ultraviolet light.

20 Claims, 17 Drawing Sheets

TEMPLATE, PATTERNING METHOD, AND METHOD FOR MANUFACTURING SEMICONDUCTOR DEVICE

CROSS-REFERENCE TO RELATED APPLICATION(S)

This application is based upon and claims the benefit of priority from Japanese Patent Application No. 2020-048142, filed Mar. 18, 2020, the entire contents of which are incorporated herein by reference.

FIELD

Embodiments described herein relate generally to a template, a patterning method, and a method for manufacturing a semiconductor device.

BACKGROUND

Imprint lithography, in which a template is pressed on a resist layer to form an etching mask, is known. In the imprint lithography, the resist layer may be formed to cover an entire surface of a film using a spin coating method.

DETAILED DESCRIPTION

Figure 1A:
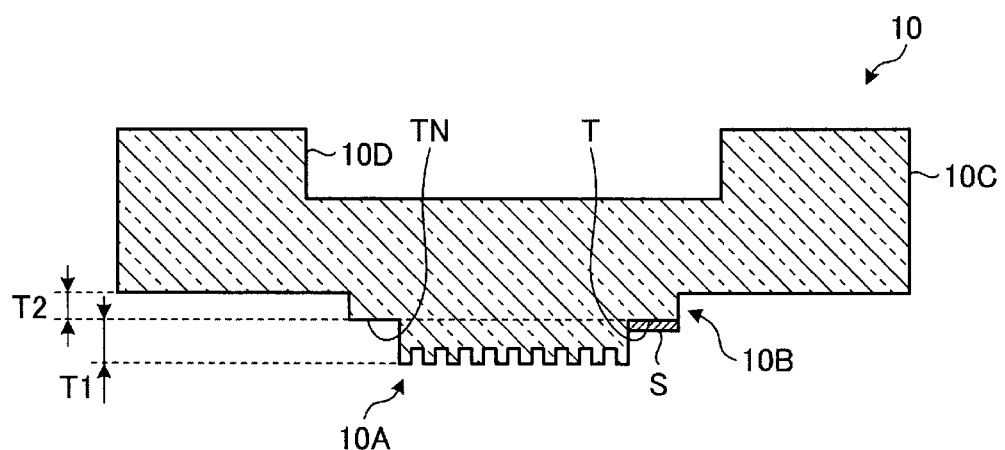
FIG. 1A is a view schematically illustrating a cross section of a template according to a first embodiment.

An embodiment provides a template that can improve patterning throughput.

In general, according to one embodiment, an imprint lithography template comprises a substrate transparent to ultraviolet light. A first mesa region is on the substrate. A surface of the first mesa region includes a pattern region to be pressed into a photocurable resist film. The pattern region has four sides. A second mesa region is also on the substrate. The first mesa region protrudes from a surface of the second mesa region. A blocking film is adjacent to two sides of the four sides pattern region. The two sides to which the blocking film is adjacent are connected to each other at a corner of the pattern region. The blocking film blocks ultraviolet light.

Hereinafter, non-limiting example embodiments will be described with reference to the appended drawings. In all the drawings, similar or substantially similar components or aspects will be given the same reference numeral, and, in general, duplicate description will not be made. The drawings are not to scale and do not intend to represent dimensional ratios of between the components or the aspects or between thicknesses of the various layers. However, one skilled in the art may still set thicknesses and dimensions by reference to the following examples.

First Embodiment

Figure 1B:
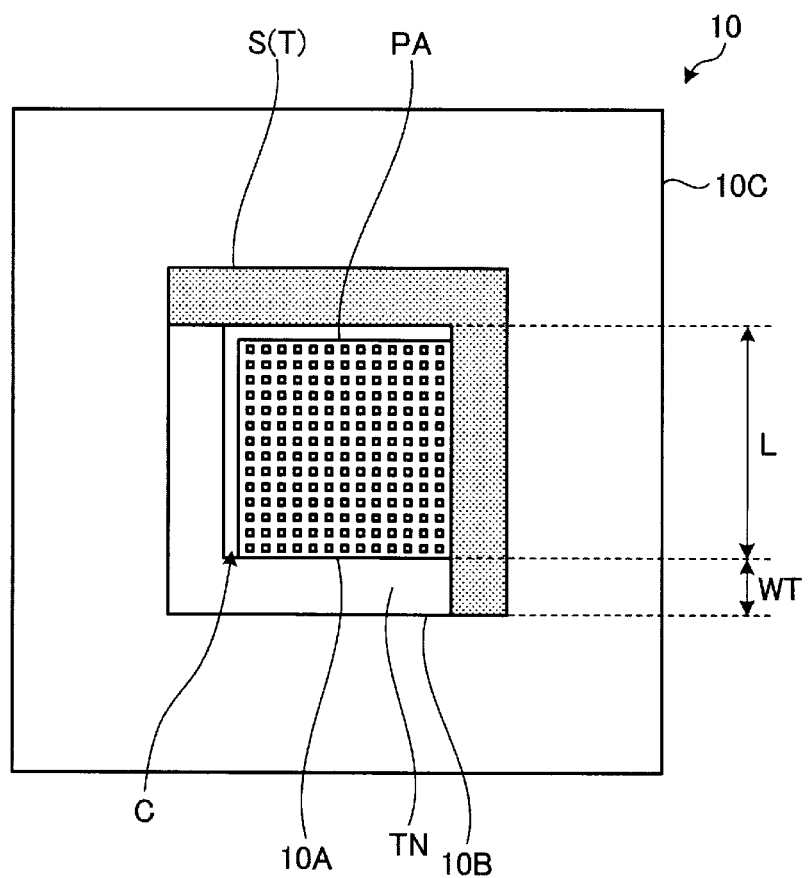
FIG. 1B is a view schematically illustrating a plan view of a template according to a first embodiment

FIG. 1A is a view schematically illustrating a cross section of a template 10 according to a first embodiment. FIG. 1B is a view of a lower surface of the template 10. In the following description, the lower surface refers to a surface that faces a resist layer when the template 10 is pressed on the resist layer.

The template 10 is formed from a material that can transmit ultraviolet light, such as quartz, glass, or a resin. The template 10 includes a first mesa 10A, a second mesa 10B, and a substrate 10C, as illustrated in FIG. 1A. The substrate 10C has a substantially rectangular shape in a plan view. At an upper surface of the substrate 10C, a hollow 10D is provided.

In this embodiment, the second mesa 10B also has a substantially rectangular shape in a plan view, and protrudes downward from an approximate center of a lower surface of the substrate 10C. For example, a difference T2 in height between the second mesa 10B and the substrate 10C may be some tens of micrometers.

In this embodiment, the first mesa 10A also has a substantially rectangular shape in a plan view, and protrudes downward from a lower surface of the second mesa 10B. A lower surface of the first mesa 10A includes a patterned region of recessed and protruding areas that corresponds to a pattern to be formed in an imprint resist. The patterned region may be formed using nanoimprint lithography electron beam lithography, photolithography, or the like. For example, a difference T1 in height between the first mesa 10A and the second mesa 10B may be several micrometers. For example, a length L of each side of the first mesa 10A may fall within a range of several millimeters to several centimeters.

As illustrated in FIG. 1B, the region PA (hereinafter referred to as pattern region PA) of recessed and protruding portions is formed in the first mesa 10A, but does not occupy the entire area of the first mesa 10A. The pattern region PA is shifted in a direction to one side of the first mesa 10A and in a direction of another side adjacent to the side. Therefore, a flat gap C is provided between the pattern region PA and the external edges of the first mesa 10A along two sides of the first mesa 10A. When the first mesa 10A is pressed on the resist layer 12, a region corresponding to the gap C is made flat. This flat region can be used as a region for dicing during chip detachment (also referred to as dicing region, scribing region, kerf region, or the like). Specifically, the pattern region PA of the first mesa 10A corresponds to a chip region, and the gap C corresponds to a dicing region in the chip region. The whole first mesa 10A corresponds to a pressing region to be pressed on the resist layer (also referred to shot region). Without providing the gap C, a dicing region could be formed by leaving a gap G between shot regions as described below. The gap C is not limited to being on just the two sides. The gap C may be provided along four sides.

In this embodiment, the first mesa 10A is smaller than the second mesa 10B, but is disposed concentrically with the second mesa 10B. Specifically, the center of the first mesa 10A is coincident with the center of the second mesa 10B in a plan view, and each side of the first mesa 10A is parallel to each corresponding side of the second mesa 10B. Therefore, a part of the lower surface of the second mesa 10B is exposed outside the perimeter of the first mesa 10A, and each side of the exposed surface has a constant width in this embodiment. Hereinafter, the exposed surface is referred to as terrace surface. For example, the terrace surface may have a width WT of several micrometers to several millimeters.

On this terrace surface, a light shielding area S is formed as a light transmission restriction area along two adjacent sides of four sides. For example, the light shielding area S may be formed by coating with a metal or the like. For example, a material constituting the light shielding area S may include a metal material and one or more of an oxide, a nitride, or an oxynitride thereof. Specific examples of the metal material may include chromium (Cr), molybdenum (Mo), tantalum (Ta), tungsten (W), zirconium (Zr), and titanium (Ti). In this case, the light shielding area S can block transmission of ultraviolet light. It is preferable that the transmittance of the light shielding area S at a wavelength of 365 nm be 10% or less. Any region on the terrace surface where the light shielding area S is not formed transmits ultraviolet light. In the following description, the region of the terrace surface on which the light shielding area S is formed, is referred to as terrace surface T, and the region of the terrace surface on which the light shielding area S is not formed is referred to as terrace surface TN for the sake of convenience (see FIGS. 1A and 1B).

Figure 2:
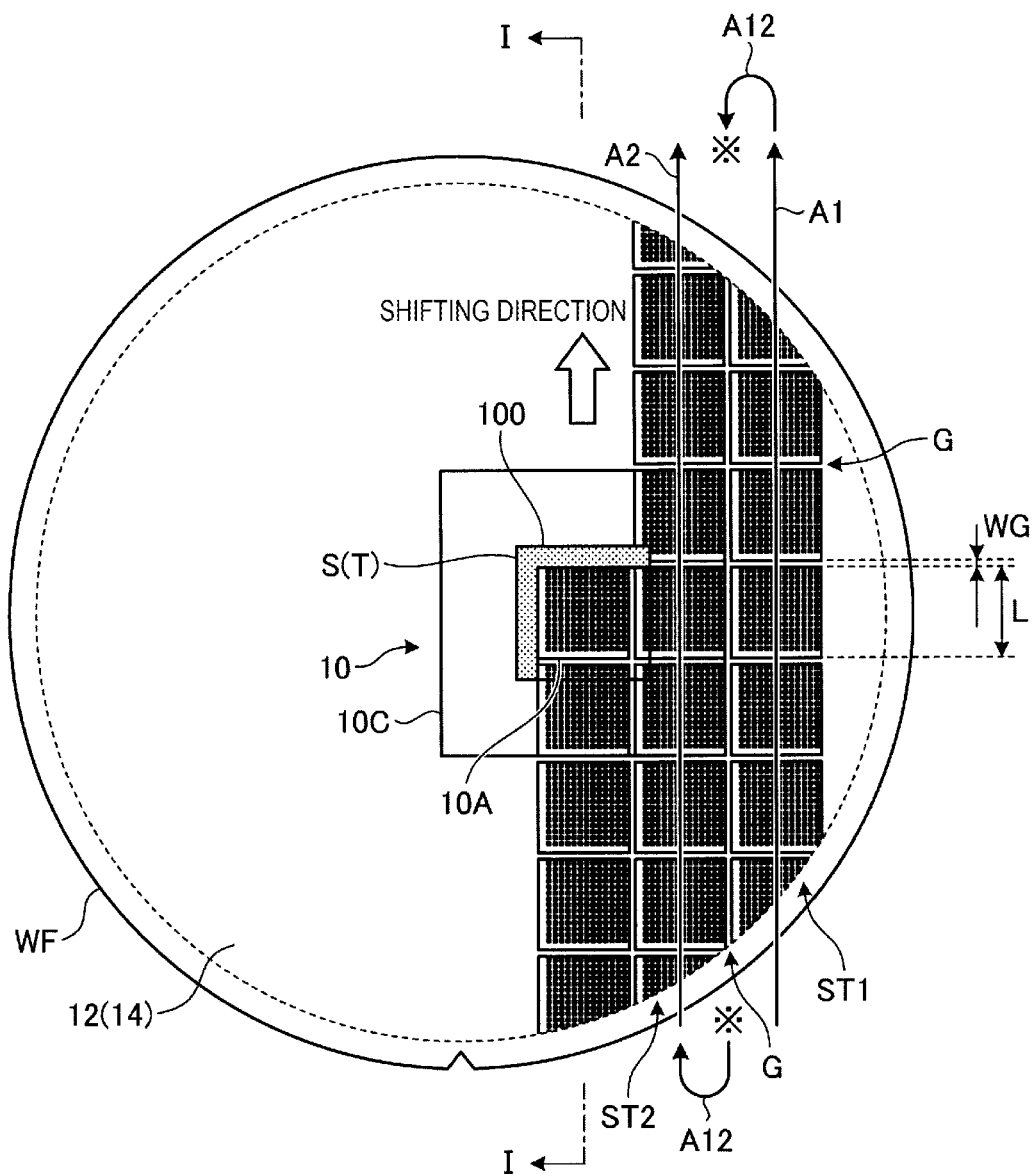
FIG. 2 is a view illustrating a patterning method using the template according to the first embodiment.

Next, a patterning method using the template 10 according the first embodiment will be described. FIG. 2 is a top view illustrating an example of an order of pressing the template 10 on a resist layer. A resist layer 12 is applied to cover an entire surface of a film to be etched that has already been formed on the wafer WF. The resist layer 12 may be formed by a spin coating method. As illustrated in FIG. 2, the template 10 is first pressed on the resist layer 12 starting along the column in the direction of an arrow A1. Specifically, the first mesa 10A (FIGS. 1A and 1B) is first pressed at a start position ST1 of the resist layer 12. When the resist layer 12 is irradiated with ultraviolet light through the first mesa 10A during pressing, the resist is cured, and the shape of the recessed and protruding area of the first mesa 10A is transferred to the resist layer 12. Subsequently, the template 10 is separated from the resist layer 12 and shifted in the direction of the arrow A1 by predetermined amount by drive apparatus and supporting tool. The shifting distance corresponds to the sum of the length L of one side of the first mesa 10A and a length WG (e.g., several micrometers) of the gap G left between shot regions. Pressing, irradiation with ultraviolet light, separating, and then shifting in the direction of the arrow A1 are repeated across the wafer WF.

When the series of pattern transfers along the direction of the arrow A1 is completed, the template 10 is shifted in the direction of an arrow A12 in FIG. 2. The shifting distance of the template 10 in a transverse direction in FIG. 2 corresponds to the sum of the width W of the first mesa 10A and the length WG of the gap G between shot regions. Subsequently, another series of pattern transfers from a start position ST2 of the resist layer 12 in the direction of an arrow A2 is carried out. Similarly, pressing, irradiation with ultraviolet light, separating, and then shifting are repeated on the entire surface of the wafer WF. Thus, a patterning process is eventually completed across the full wafer WF.

Herein, when the template 10 is shifted in the direction of the arrow A1 or A2 as illustrated in FIG. 2, the light shielding area S is disposed in front of the first mesa 10A and on a left side thereof in a direction of shifting the template 10. As a result, the region of the resist layer 12 where the first mesa 10A is not pressed is not irradiated with ultraviolet light, and the region where the first mesa 10A is pressed is irradiated with ultraviolet light. This will be described further with reference to FIG. 3.

Figure 3:
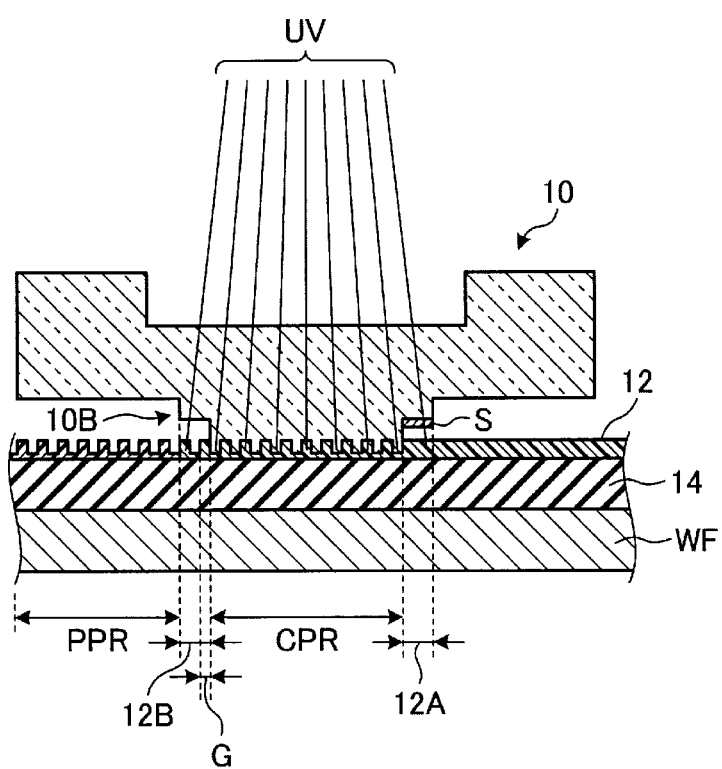
FIG. 3 is a view schematically illustrating cross sections of a resist layer and the template according to the first embodiment that is pressed on the resist layer.

FIG. 3 is a partially enlarged cross-sectional view taken along a line I-I of FIG. 2. As illustrated in FIG. 3, a film-to-be-etched 14 is formed on the wafer WF, and the resist layer 12 is formed on the film-to-be-etched 14. Herein, the first mesa 10A of the template 10 is pressed on a pressing region CPR of the resist layer 12, and the resist layer 12 is irradiated with ultraviolet light through the first mesa 10A. Therefore, the photocurable imprint resist on the pressing region CPR is exposed to ultraviolet light and cured.

Ultraviolet light (UV) is emitted from a light source is collimated by a predetermined optical system, and directed to the first mesa 10A of the template 10. However, ultraviolet light tends to spread (or leak) outward toward both sides of the first mesa 10A. As a result, ultraviolet light may reach the terrace surfaces T and TN (see FIGS. 1A and 1B) of the second mesa 10B.

As illustrated in FIG. 3, the resist layer 12 is also present below the terrace surfaces T and TN of the second mesa 10B. This is because the resist layer 12 is initially formed over the full surface of the film-to-be-etched 14 by a spin coating method, as described above. Therefore, any ultraviolet light that is passed through the terrace surfaces T and TN and reaches the resist layer 12 exposes (cures) the resist layer 12. However, ultraviolet light does not significantly reach region 12A below the light shielding area S since the light shielding area S blocks ultraviolet light. Therefore, photocurable resist on the region 12A is prevented from curing. It is necessary that the region 12A be contained in a region that is pressed by the first mesa 10A next to the pressing region CPR, and have maintained flowability without curing until later patterning. Such flowability can be maintained by the light shielding area S.

In contrast, the region 12B opposite to the region 12A that falls below the surface TN are irradiated with ultraviolet light through the terrace surface TN. The region 12B includes an area that has been pressed by the first mesa 10A and exposed and the gap G between shot regions. Herein, the "exposed area" is an area where a photocurable imprint resist is cured by irradiation with ultraviolet light when the first mesa 10A is pressed on a pressing region PPR before the pressing region CPR. Even when such a cured area is further irradiated with ultraviolet light, the properties of such an area are not significantly further changed.

The gap G between shot regions in FIG. 3 is below the light shielding area S, that is, is contained in the region 12A when the first mesa 10A is pressed on the pressing region PPR. Therefore, a photocurable resist in the gap G between shot regions is not irradiated with ultraviolet light. Specifically, when the first mesa 10A is pressed on the pressing region CPR, the photocurable resist in the gap G between shot regions in FIG. 3 is not cured. When the pressing region CPR is irradiated with ultraviolet light, the photocurable resist on the gap G between shot regions is irradiated with ultraviolet light through the terrace surface TN, and then cured.

Hereinafter, certain effects described above will be further described with reference to Comparative Examples.

Comparative Example 1

Figure 4A:
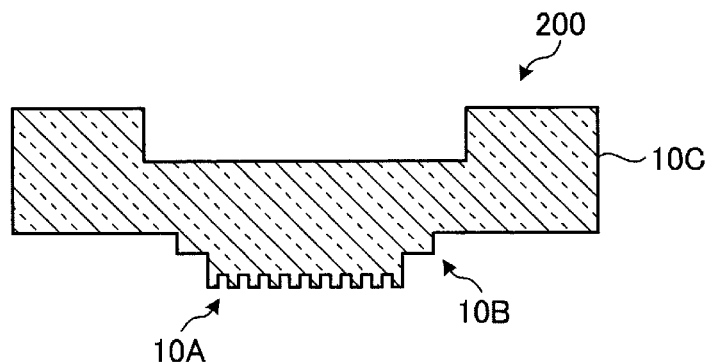
FIGS. 4A, 4B, and 4C are views illustrating an imprint template according to Comparative Example 1.

FIG. 4A is a view schematically illustrating across section of a template 200 according to Comparative Example 1. For example, the template 200 is formed from quartz glass. The template 200 includes the first mesa 10A, the second mesa 10B, and the substrate 10C, as illustrated in FIG. 4A. However, the light shielding area S is not provided, unlike the template 10 according to the first embodiment.

Figure 4B:
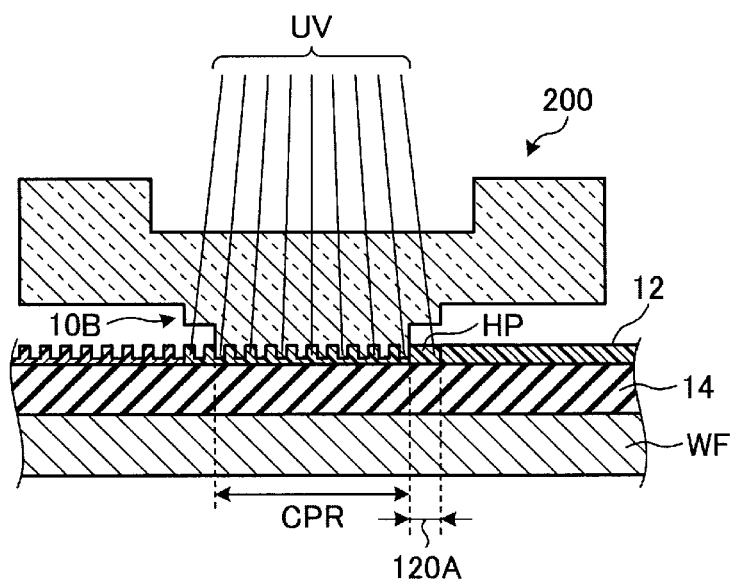

With reference to FIG. 4B, the first mesa 10A of the template 200 according to Comparative Example 1 is pressed on the pressing region CPR of the resist layer 12, and a photocurable resist on the pressing region CPR is irradiated with ultraviolet light. Due to an absence of light shielding area S, ultraviolet light is passed through the terrace surface, and also reaches a region 120A outside the pressing region CPR. Therefore, any photocurable resist on the region 120A is exposed, and cured into a cured area HP.

Figure 4C:
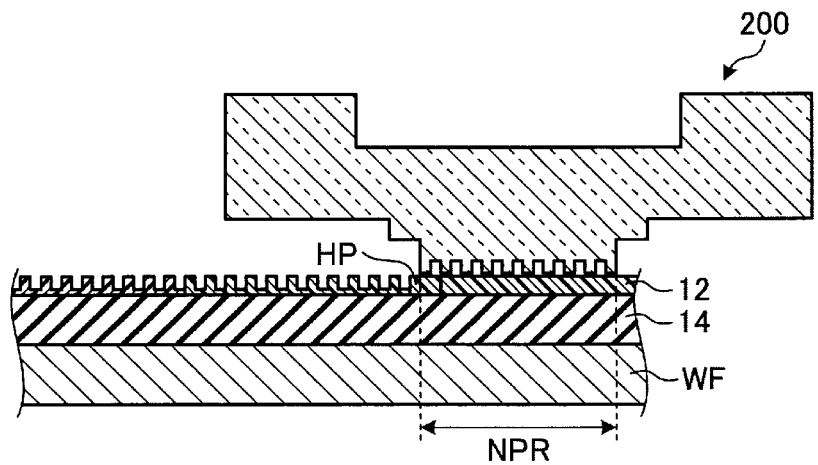

When the first mesa 10A is pressed on a subsequent pressing region NPR, the first mesa 10A is also pressed on the cured area HP, as illustrated in FIG. 4C. Since the cured area HP is cured, the first mesa 10A cannot uniformly be pressed on the pressing region NPR. For example, the first mesa 10A may be tilted. As a result, the shape of the recessed and protruding area of the first mesa 10A is not uniformly transferred to the pressing region NPR of the resist layer 12, and the ultimate device/die yield may be decreased.

When the template 10 according to the embodiment is used, the photocurable resist on the region 12A (FIG. 3) is not significantly irradiated with ultraviolet light due to the light shielding area S. Therefore, the photocurable resist is not substantially cured, and the flowability of the resist material can be maintained. During subsequent pressing, uniform pressing on the region 12A can be achieved like photocurable resist on any area other than the region 12A. As a result, a transferred pattern can be made more uniform, and a decrease in yield that may be caused by the cured area HP in Comparative Example 1 can be avoided.

Comparative Example 2

Figure 5A:
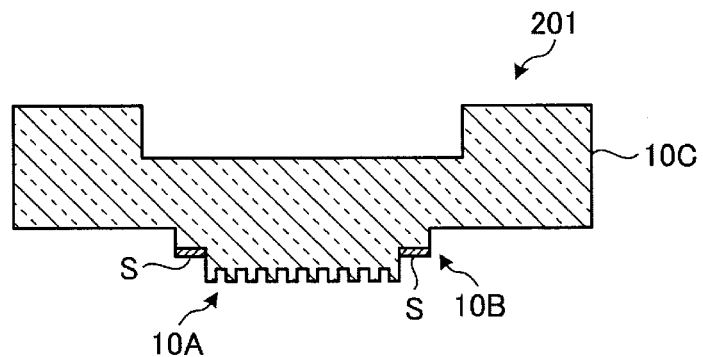
FIGS. 5A and 5B are views illustrating an imprint template according to Comparative Example 2.
Figure 5B:
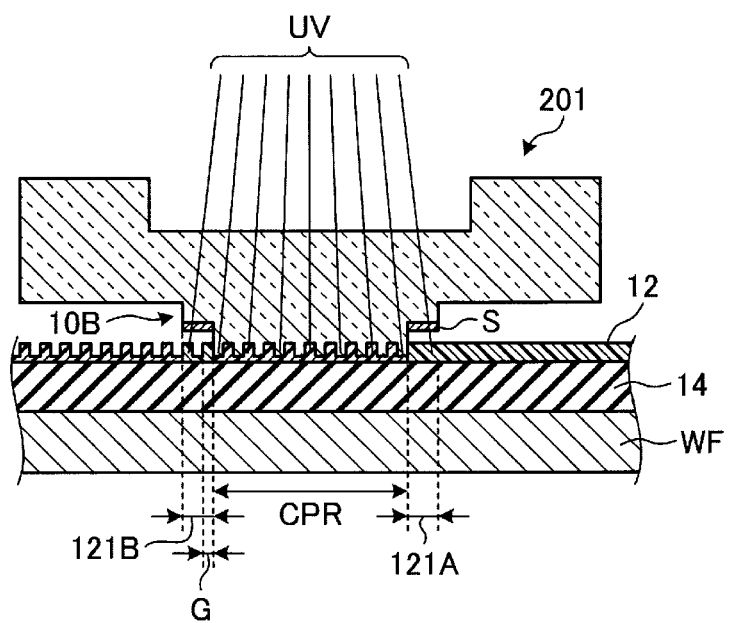

Next, Comparative Example 2 will be described. FIG. 5A is a view schematically illustrating a cross section of a template 201 according to Comparative Example 2. For example, the template 201 is also formed from quartz glass. The template 201 includes the first mesa 10A, the second mesa 10B, and the substrate 10C, as illustrated in FIG. 5A. In the template 201 according to Comparative Example 2, the light shielding area S is provided on the entire surface of the terrace surface of the second mesa 10B. Thus, a region 121A is not significantly irradiated with ultraviolet light when the first mesa 10A is pressed on the pressing region CPR and irradiated with ultraviolet light, as illustrated in FIG. 5B. When the first mesa 10A is pressed on a region next to the pressing region CPR, the photocurable resist below the region 121A can still have flowability. Therefore, the first mesa 10A can uniformly be pressed on the region.

However, due to the coverage of the light shielding area S in this comparative example, a region 121B is not significantly irradiated with ultraviolet light. Therefore, a photocurable resist in the gap G between shot regions in the region 121B is not cured, and the flowability is maintained. When a wafer on which uncured photocurable resist remains is transported for a subsequent process, the uncured resist may flow out of the gap G to cause a defect. In order to prevent such a defect, it is necessary that any uncured resist be subsequently irradiated with ultraviolet light (or otherwise cured) after completion of pressing of the template 201. That is, another process step is required with the Comparative Example 2 before transport of the wafer.

According to the first embodiment, the region 12B is irradiated with ultraviolet light through the terrace surface TN having no light shielding area S while the template 10 is being pressed on the pressing region CPR, as illustrated in FIG. 3. Therefore, a photocurable resist in the gap G between shot regions can be cured at this time. Accordingly, the need for a subsequent process for curing any uncured resist, which is required in Comparative Example 2, can be eliminated.

As described above, the patterning method using the template 10 according to the first embodiment can avoid irradiating of the photocurable resist in a region where the first mesa 10A will be subsequently pressed. This is because the light shielding area S is disposed in front of the first mesa 10A in the shifting direction of the template 10. Therefore, the photocurable resist in the region is not cured, and the flowability can be maintained. Accordingly, the first mesa 10A can uniformly be pressed on the next region, and a pattern of the first mesa 10A can uniformly be transferred.

As illustrated in FIG. 3, the light shielding area S is disposed not only in front of the first mesa 10A in the shifting direction of the template 10 but also on a side of the first mesa 10A. Therefore, a region below the side of the light shielding area S is not irradiated with ultraviolet light, and the flowability of a photocurable resist at this region can also be maintained. Therefore, the first mesa 10A can uniformly be pressed on the region. That is, when the light shielding area S is provided on the terrace surface T of the second mesa 10B in front of the first mesa 10A in the shifting direction of the template 10 and on the side of the first mesa 10A, the first mesa 10A can uniformly be pressed.

On the other hand, ultraviolet light can be passed through the terrace surface TN where the light shielding area S of the second mesa 10B is not provided. Therefore, a photocurable resist below the terrace surface TN can be irradiated with ultraviolet light that spreads outside the first mesa 10A. Below the terrace surface TN, uncured photocurable resist is present, but the photocurable resist is exposed to ultraviolet light that is passed through the terrace surface TN, and thus cured. This avoids an additional process of exposing and curing any uncured photocurable resist in the gap G between shot regions.

Of the terrace surface T including no light shielding area S of the second mesa 10B, an area that extends parallel to the shifting direction of the template 10 also transmits ultraviolet light. Therefore, any uncured photocurable resist in the gap G between shot regions that extends in the shifting direction of the template 10 is exposed to ultraviolet light that is passed through the terrace surface T, and thus cured. That is, the photocurable resist in the gap G between shot regions can also be cured without a separate exposure process.

Figure 6A:
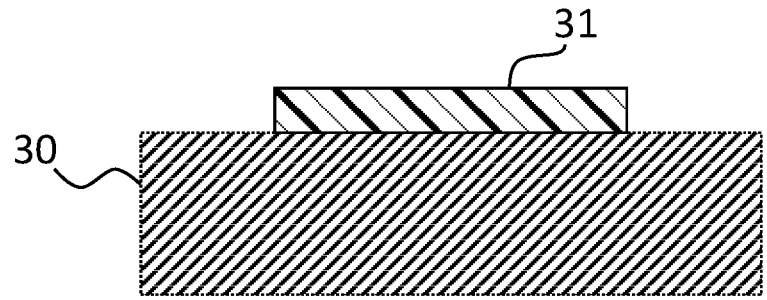
FIGS. 6A to 6J are views illustrating aspects of a method for manufacturing a template according to a first embodiment.
Figure 6B:
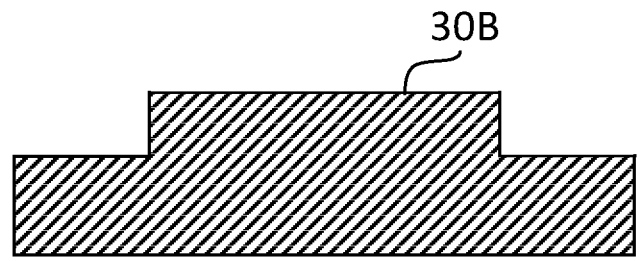
Figure 6C:
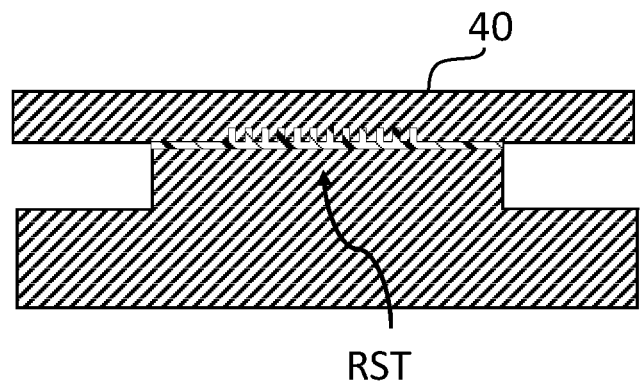
Figure 6D:
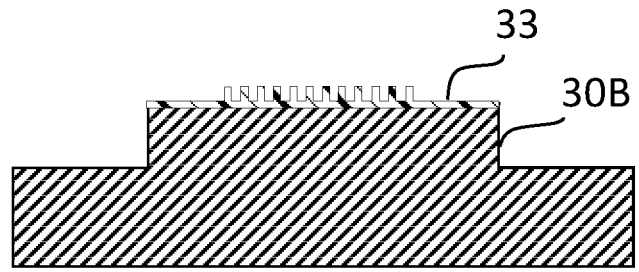
Figure 6E:
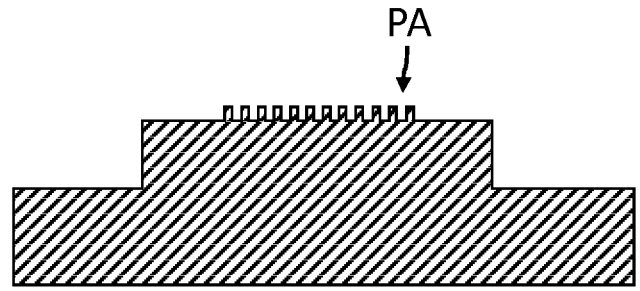
Figure 6F:
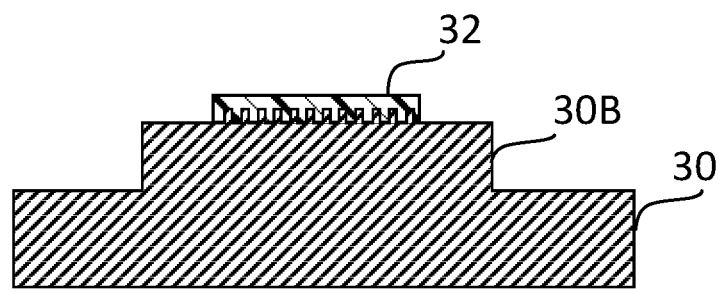

Subsequently, a method for manufacturing the template 10 according to the first embodiment will be described with reference to FIGS. 6A to 6J. A substrate 30 that is a starting material and illustrated in FIG. 6A is prepared, and on the substrate 30, a resist pattern 31 that covers a region ultimately corresponding to the second mesa 10B is formed. For example, the substrate 30 is formed from a material that can transmit ultraviolet light, such as quartz glass or a resin. Subsequently, the substrate 30 is etched by wet etching with the resist pattern 31 thereon, and a bulge 30B that corresponds to the second mesa 10B is formed as illustrated in FIG. 6B. A resist is then applied or added dropwise to an upper surface of the bulge 30B to form a resist layer. On this resist layer, a master template 40 is pressed. The master template 40 includes a plurality of recess parts that correspond to a recessed and protruding pattern of the recessed and protruding region PA of the first mesa 10A. When the master template 40 is pressed on the resist layer, the recess parts are filled with a resist RST (FIG. 6C). While the master template 40 is being pressed, the resist RST is irradiated with ultraviolet light through the master template 40. As a result, the resist RST is cured. The master template 40 is then detached, and the residual resist on the upper surface of the bulge 30B is removed from flat areas other than the recess parts of the master template 40 (FIG. 6D). As a result, a resist pattern 33 is formed on the bulge 30B. Next, the bulge 30B is etched by dry etching using the resist pattern 33 as mask to form the second mesa 10B having the recessed and protruding region PA (FIG. 6E).

Figure 6G:
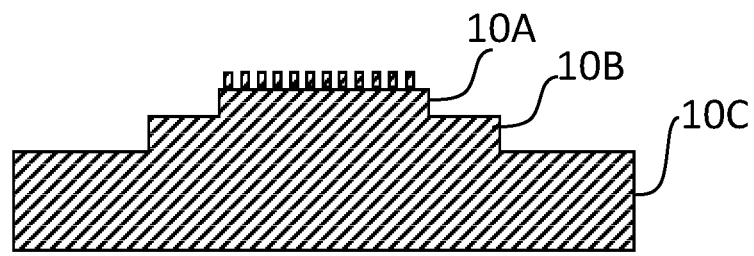

Next, a resist pattern 32 that covers the bulge 30B and a part of an upper surface of the substrate 30 is formed (FIG. 6F), and the substrate 30 is further etched by dry etching using the resist pattern 32 as a mask. The resist pattern 32 is then removed and the first mesa 10A is obtained (FIG. 6G).

Figure 6H:
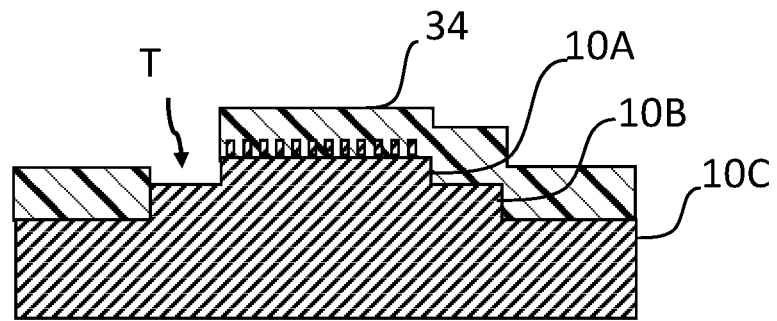
Figure 6I:
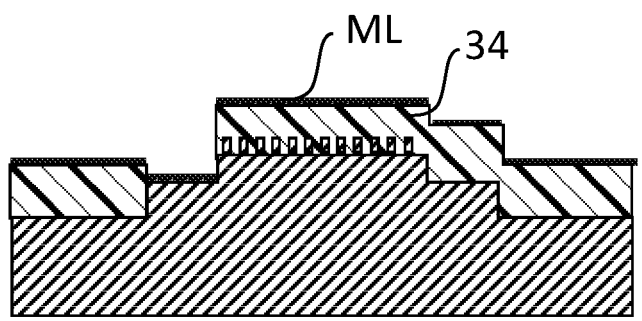
Figure 6J:
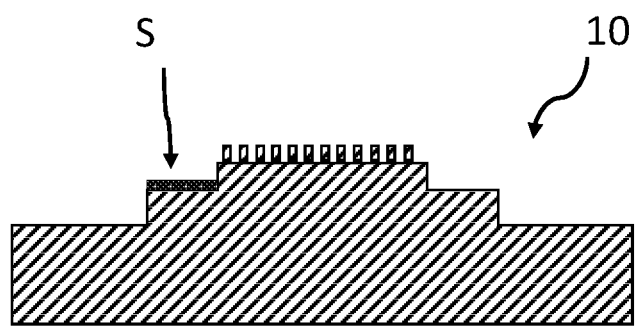

Next, a resist pattern 34 that covers the first mesa 10A, the second mesa 10B, and the substrate 10C is formed (FIG. 6H). The resist pattern 34 has an opening in which the terrace surface T of the second mesa 10B is exposed. As illustrated in FIG. 6I, a metal film ML is then formed on the resist pattern 34. For example, the metal film ML may be formed from chromium (Cr) as a raw material by vacuum evaporation. Herein, the metal film ML is formed on the resist pattern 34 and also a bottom of the opening (i.e., on the terrace surface T exposed by the opening in resist pattern 34). When the resist pattern 34 is then removed, the metal film ML on the resist pattern 34 is also removed in this process (lift-off process), and the metal film ML on the terrace surface T is left. As a result, the light shielding area S is formed on the terrace surface T. Thus, a process of forming the template 10 is completed. Templates according to the following embodiments (modifications) may be manufactured similarly.

Modification of First Embodiment

Figure 7:
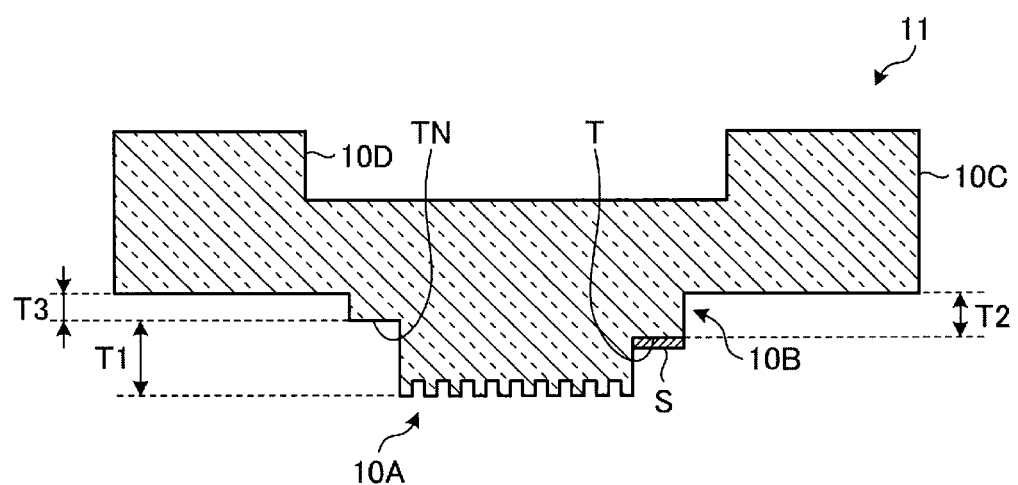
FIG. 7 is a view schematically illustrating a cross section of a template according to a modification of a first embodiment.

Next, a template according to a modification of the first embodiment will be described with reference to FIG. 7. Like the template 10 according to the first embodiment, a template 11 according to the modification is formed from a material that can transmit ultraviolet light (e.g., quartz glass or a resin), and includes the first mesa 10A, the second mesa 10B, and the substrate 10C, as illustrated in FIG. 7. On a region (terrace surface T) along two adjacent sides of four sides of the terrace surface of the second mesa 10B, the light shielding area S is provided, and on a region (terrace surface TN) along other adjacent two sides, the light shielding area S is not provided.

In this modification, a difference T3 in height between the terrace surface TN including no light shielding area S and the substrate 10C differs from the difference T2 in height between the terrace surface T including the light shielding area S and the substrate 10C, as illustrated in FIG. 7. In the illustrated modification, the difference T3 is smaller than the difference T2. In other words, the terrace surface TN including no light shielding area S is disposed above the lower surface of the first mesa 10A as compared to the terrace surface T including the light shielding area S.

The difference T3 may be larger than the difference T2. That is, the terrace surface TN including no light shielding area S may be closer to the resist layer 12 than the terrace surface T including the light shielding area S. For example, when the difference T3 is adjusted, the terrace surface T including no light shielding area S can be brought into contact with the resist layer 12. In this case, while the terrace surface T is pressed on a photocurable resist in the gap G, the photocurable resist can be irradiated with ultraviolet light. This can improve flatness of the surface.

Second Embodiment

Figure 8A:
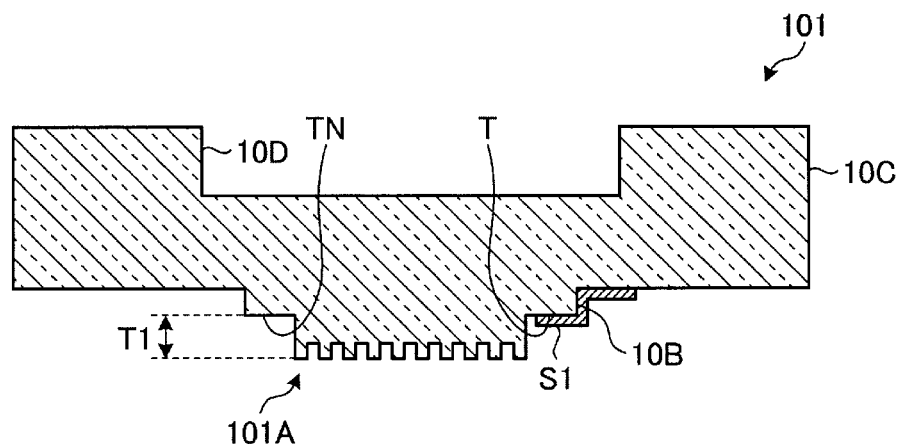
FIG. 8A is a view schematically illustrating a cross section of a template according to a second embodiment.
Figure 8B:
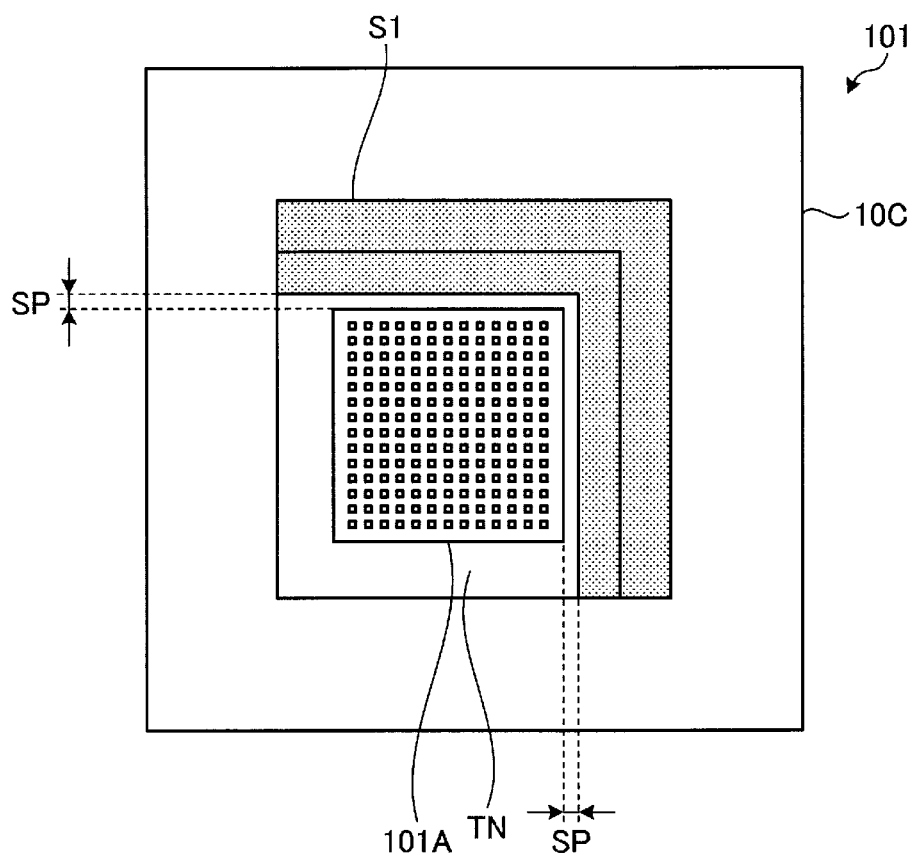
FIG. 8B is a view schematically illustrating a plan view of a template according to a second embodiment

Next, a template according to a second embodiment will be described. FIG. 8A is a view schematically illustrating a cross section of the template according to the second embodiment. FIG. 8B is a view of a lower surface of the schematically illustrated template according to the second embodiment.

As illustrated in FIGS. 8A and 8B, a template 101 according to the second embodiment includes a first mesa 101A, the second mesa 10B, and the substrate 10C. The second mesa 10B and the substrate 10C are the same as those in the template 10 according to the first embodiment. The first mesa 101A is different from the first mesa 10A of the template 10, and the entire lower surface of the first mesa 101A corresponds to a pattern region. Therefore, the template 101 does not include the gap C illustrated in FIG. 1B.

The template 101 has a light shielding area S1 that is different from the light shielding area S of the template 10. The light shielding area S1 is provided along two adjacent sides of four sides of the second mesa 10B. As illustrated in FIGS. 8A and 8B, the light shielding S1 covers not only the terrace surface T of the second mesa 10B but also a side wall surface of the second mesa 10B and a part of the lower surface of the substrate 10C. In other words, when in addition to the light shielding area S in the first embodiment, another light shielding area is formed for the side wall surface of the second mesa 10B and a part of the lower surface of the substrate 10C, the light shielding area S1 is obtained. As seen from FIGS. 8A and 8B, the light shielding area S1 may not be in contact with the side wall surface of the first mesa 101A at the terrace surface T of the second mesa 10B. Therefore, a space SP may be present between the light shielding area S1 and the side wall surface of the first mesa 101A.

In the template 101 according to the embodiment, the difference T1 in height between the first mesa 101A and the second mesa 10B is adjusted depending on the thickness of the resist layer on which the first mesa 101A is pressed. Specifically, in this embodiment, the difference T1 is set so as to bring the lower surface (terrace surface) of the second mesa 10B into contact with the resist layer when the first mesa 101A is pressed on the resist layer.

Patterning using the template 101 having the aforementioned configuration is carried out in the same manner as the method described with reference to FIG. 2. That is, when the template 101 is shifted in the direction of the arrow A1 or A2 in FIG. 2, a side of the light shielding area S1 is disposed in front of the first mesa 101A in the shifting direction, and another side of the light shielding area S1 is disposed on the left side thereof. A side of the terrace surface TN including no light shielding area S1 is disposed behind the first mesa 101A in the shifting direction, and another side of the terrace surface is disposed on the right side thereof. Thus, the template 101 according to the second embodiment is disposed like the template 10, and the template 101 is pressed on the resist layer 12 while the template 101 is shifted. According to the embodiment, the same effects as the effects caused in the first embodiment can be obtained. In this embodiment, the shifting distance when the template 101 is shifted in the horizontal direction may be made equal to the length L of each side of the first mesa 101A.

In the template 101 according to the embodiment, the light shielding area S1 extends to the side wall surface of the second mesa 10B and a part of the lower surface of the substrate 10C. Therefore, the template 101 can certainly block ultraviolet light that leaks outside the first mesa 101A.

In the template 101 according to the embodiment, the difference T1 in length between the first mesa 101A and the second mesa 10B is set so as to bring the lower surface of the second mesa 10B into contact with the resist layer when the first mesa 101A is pressed on the resist layer. Therefore, the following effects are obtained.

Figure 9A:
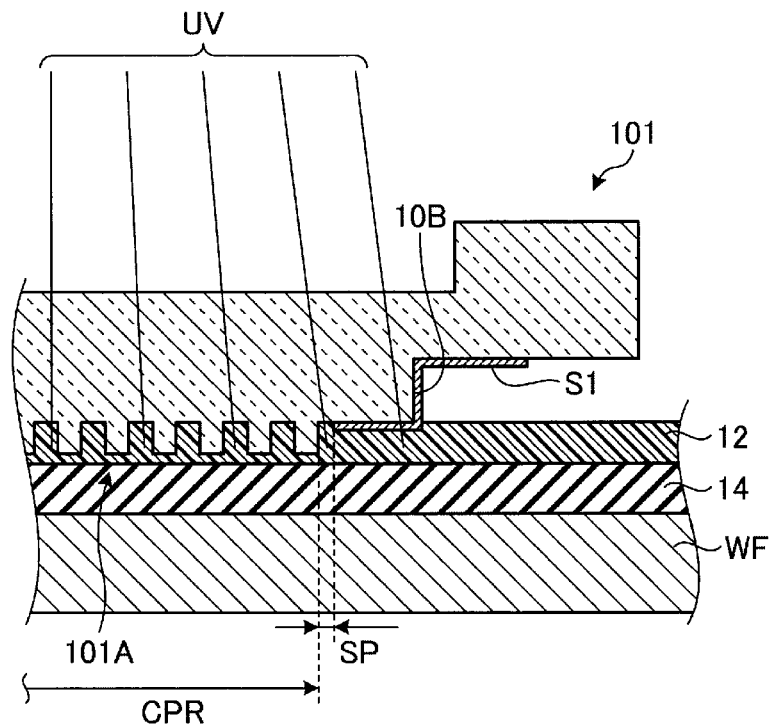
FIGS. 9A, 9B, and 9C are views illustrating a patterning method using the template according to the second embodiment.

As illustrated in FIG. 9A, the template 101 is pressed on the pressing region CPR of the resist layer 12, and the resist layer 12 is irradiated with ultraviolet light through the template 101. At that time, the terrace surface T (space SP) of the second mesa 10B is in contact with a surface of the resist layer 12. The light shielding area S1 is pressed on the resist layer 12 by the thickness of the light shielding area S1 from the surface of the resist layer 12.

Figure 9B:
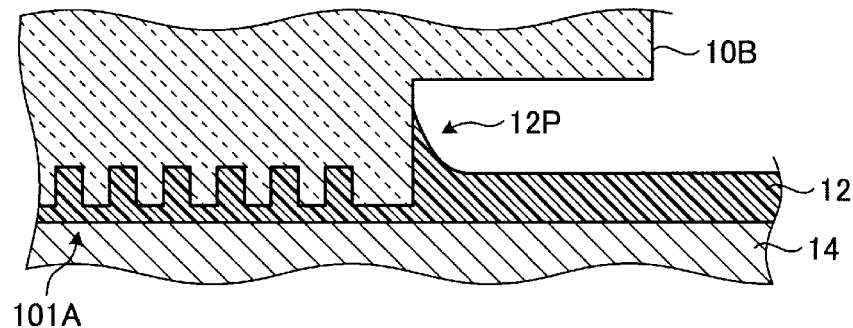

For example, when the terrace surface T of the second mesa 10B is disposed above the resist layer 12 away from the surface of the resist layer 12 as illustrated in FIG. 9B, a part of the resist layer 12 rises along the side wall surface of the first mesa 101A depending on the photocurable resist used in formation of the resist layer 12 under pressing of the first mesa 101A on the resist layer 12. As a result, a protrusion 12P may be formed. The protrusion 12P may be contained in a region where the first mesa 101A is then pressed, of the resist layer 12. Therefore, the thickness of the resist layer 12 at the region is changed due to the protrusion 12P, and uniform pressing on the resist layer 12 cannot be achieved.

Figure 9C:
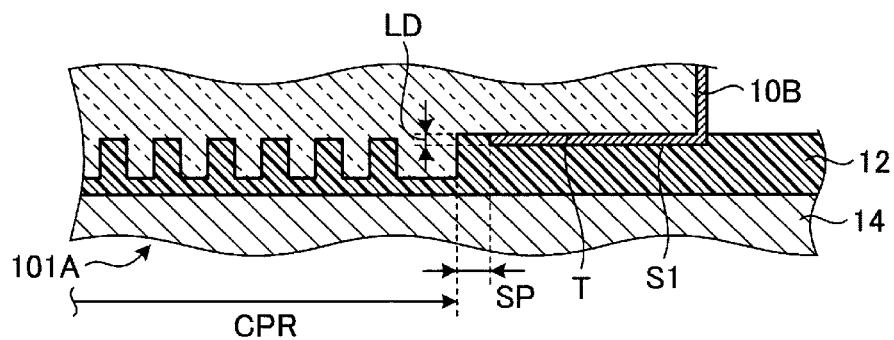

With template 101 of the embodiment, the resist layer 12 is pressed by the terrace surface T of the second mesa 10B and the light shielding area S1, as illustrated in FIG. 9C. Therefore, a photocurable resist constituting the resist layer 12 does not rise along the side wall surface of the first mesa 101A, and formation of the protrusion 12 is prevented.

Accordingly, the thickness of the resist layer 12 at the subsequent region where the first mesa 101A is pressed can uniformly be maintained.

Figure 10A:
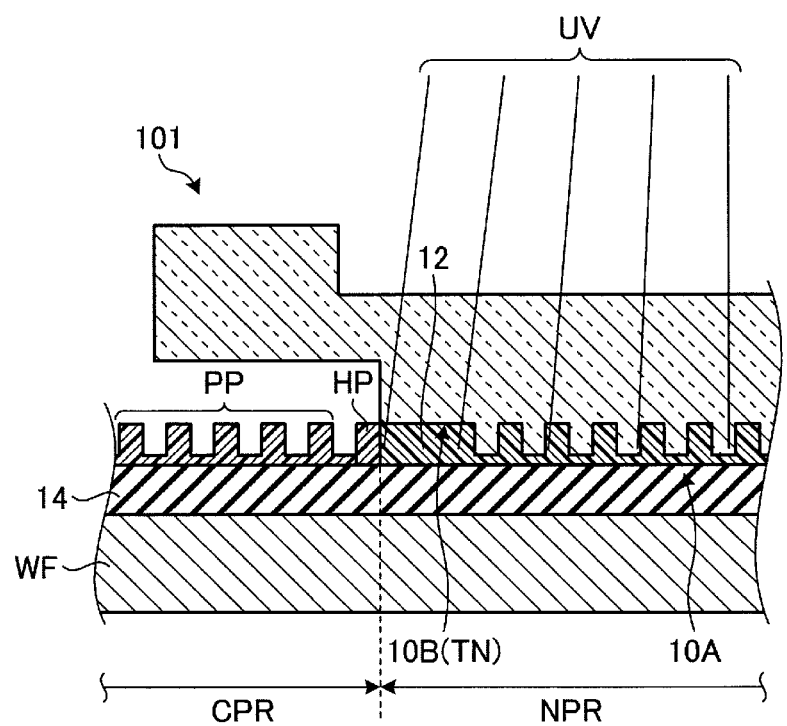
FIGS. 10A and 10B are views illustrating a continuation of the patterning method using the template according to the second embodiment.

In the template 101 according to the embodiment, a region below the space SP of the resist layer 12 is also irradiated with ultraviolet light through the space SP between the light shielding area S1 and the side wall surface of the first mesa 101A (FIG. 9A). Therefore, a photoresist at the region is exposed and cured. In this case, when the first mesa 101A is pressed on a subsequent pressing region NPR as illustrated in FIG. 10A, a photocurable resist at the pressing region CPR is already cured. The photocurable resist is a pattern PP and a cured area HP. At that time, the cured area HP does not have significant flowability. Therefore, the photocurable resist does not significantly rise along the side wall surface of the first mesa 101A.

Figure 10B:
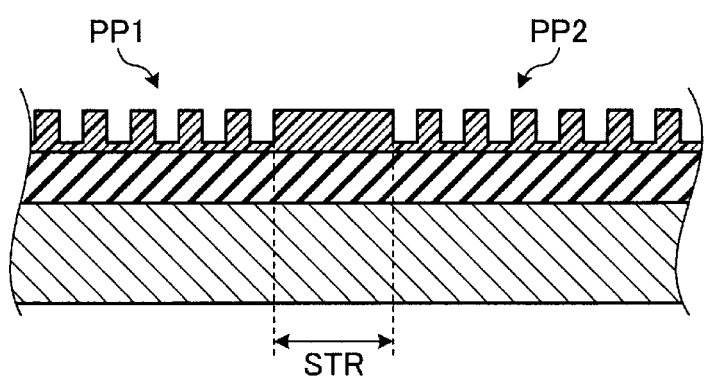

When the first mesa 101A is pressed on the pressing region CPR (FIG. 9A), the photocurable resist in a region on the right of the cured area HP of the drawing is disposed below the light shielding area S1, and ultraviolet light is blocked. Therefore, the photocurable resist is not cured, and has flowability. For example, the photocurable resist still having flowability may flow in a left direction of the drawing depending on the viscosity of the uncured resist. However, when the template 101 according to the embodiment is used, the uncured resist is held by the cured area HP, and substantial flowing can be prevented. When the first mesa 101A is pressed on the pressing region NPR as illustrated in FIG. 10A, the uncured resist is in contact with the terrace surface TN of the second mesa 10B. Under irradiation with ultraviolet light, the resist is exposed through the terrace surface TN and cured. As a result, a photocurable resist area STR that is disposed between resist patterns PP1 and PP2 and has a substantial rectangle shape in a cross-sectional view is formed as illustrated in FIG. 10B.

The photocurable resist area STR is disposed between the resist patterns PP1 and PP2 that correspond to the recessed and protruding area of the lower surface of the first mesa 101A. Therefore, the photocurable resist area STR can function as a dicing region between two elements. As described above, in the embodiment, the entire lower surface of the first mesa 101A corresponds to a pattern region, and the gap C (FIG. 1B) for a dicing region in the template 10 according to the first embodiment may not be present. However, due to the photocurable resist area STR formed so as to correspond to the terrace surface TN of the second mesa 10B, a dicing region can still be secured. The width of the dicing region may be approximately 4 μm. Therefore, the width WT of the terrace surface of the second mesa 10B may also be set similarly.

As illustrated in FIG. 9C, there is a level difference LD between the light shielding area S1 and the terrace surface T of the second mesa 10B in the template 101 according to the embodiment. However, the template is not restricted to this configuration. When a hollow has the same thickness as that of the light shielding area S1 at a region where the light shielding area S1 is formed, of the terrace surface T, the light shielding area S1 and the terrace surface T may form the same surface. In this case, the photocurable resist area STR illustrated in FIG. 10B may have a cross section shape that is closer to a rectangular shape.

Third Embodiment

Figure 11A:
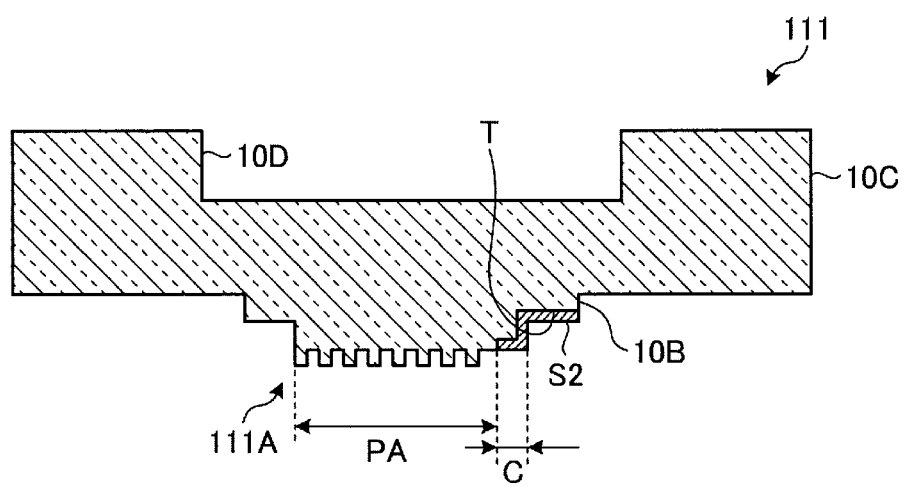
FIG. 11A is a view schematically illustrating a cross section of a template according to a third embodiment.
Figure 11B:
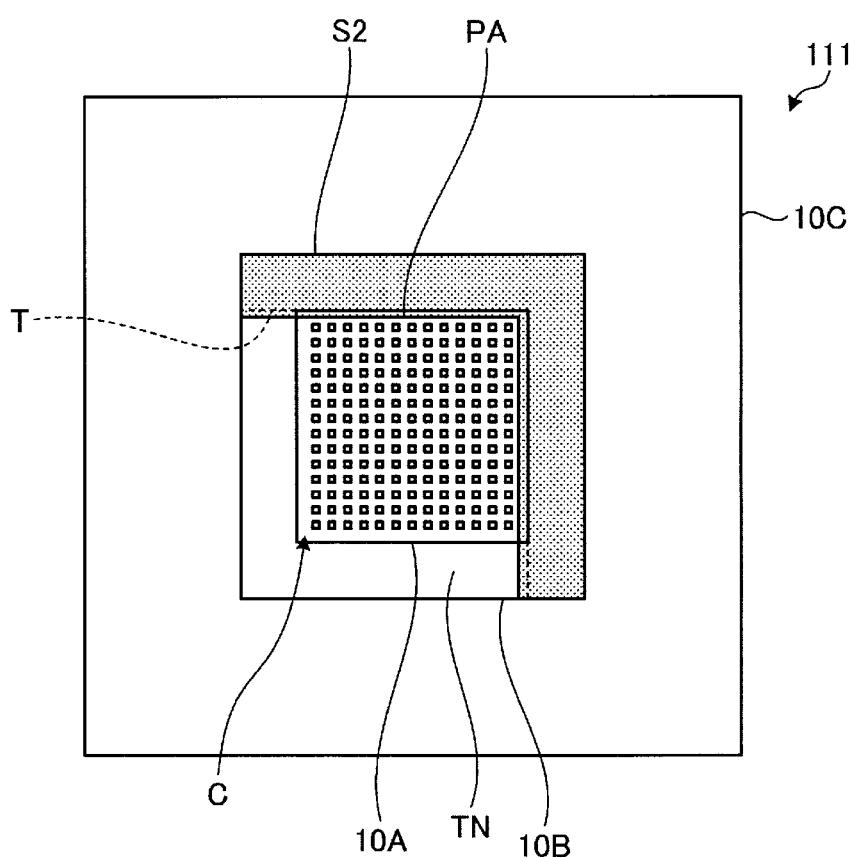
FIG. 11B is a view schematically illustrating a plan view of a template according to a third embodiment

Next, a template according to a third embodiment will be described. FIG. 11A is a view schematically illustrating a cross section of the template according to the third embodiment. FIG. 11B is a view of a lower surface of the schematically illustrated template according to the third embodiment.

As illustrated in FIGS. 11A and 11B, a template 111 according to the modification includes a first mesa 111A, the second mesa 10B, and the substrate 10C. The second mesa 10B and the substrate 10C are the same as those in the template 101 according to the second embodiment.

As illustrated in FIG. 11B, the pattern region PA and the gap C are provided on the first mesa 111A. The gap C extends along two adjacent sides of the first mesa 111A. A light shielding area S2 is provided at the gap C, the side wall surface of the first mesa 111A, and the terrace surface T of the second mesa 10B. In other words, another light shielding area of the gap C of the first mesa 111A and the side wall surface of the first mesa 111A is added to the light shielding area S in the first embodiment. In at least the gap C, a hollow has the same thickness as that of the light shielding area S2, and the light shielding area S2 is formed in the hollow. In this case, the lower surface of the gap C and the lower surface of the light shielding area S2 are the same.

Figure 12A:
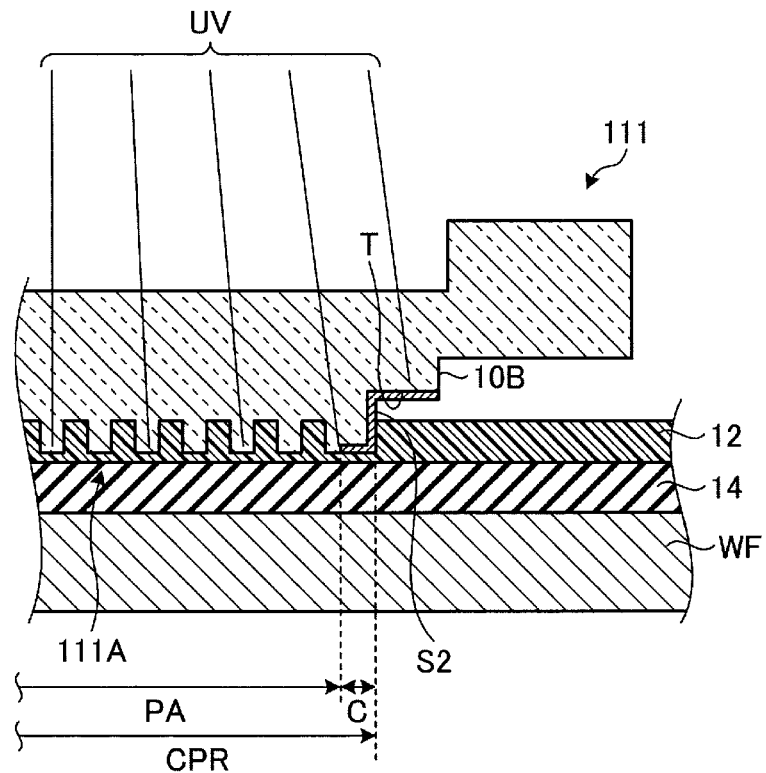
FIGS. 12A and 12B are views illustrating a patterning method using the template according to the third embodiment.

With a template 111 having the aforementioned configuration, the following pattern is formed. As illustrated in FIG. 12A, the first mesa 111A is pressed on the pressing region CPR of the resist layer 12. When the first mesa 111A is pressed on the resist layer 12 as illustrated in FIG. 12A, the light shielding area S2 is also pressed on the resist layer 12. The photocurable resist pressed by the light shielding area S2 is not irradiated with ultraviolet light. Therefore, the resist at the light shielding area S2 is pressed, but is not cured. On the other hand, a photocurable resist below the pattern region PA is irradiated with ultraviolet light and cured.

Figure 12B:
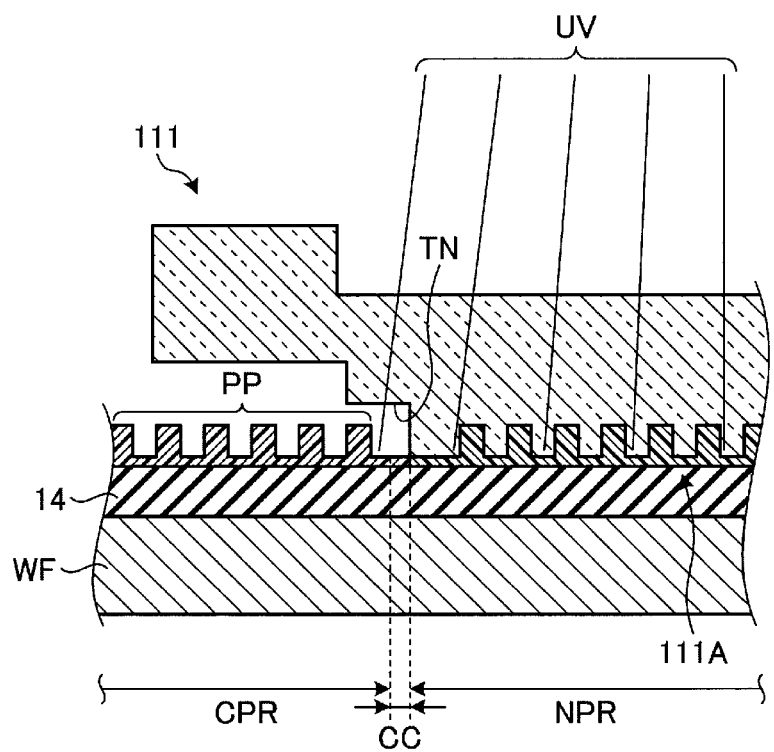
Figure 13:
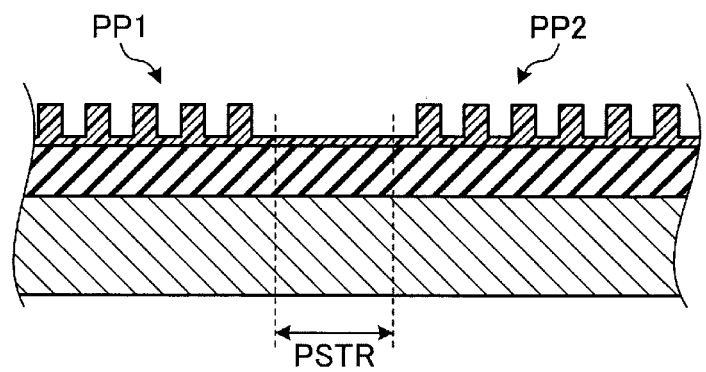
FIG. 13 is a view illustrating the patterning method using the template according to the third embodiment, which follows FIGS. 12A and 12B.

As illustrated in FIG. 12B, the first mesa 111A is pressed on the pressing region NPR next to the pressing region CPR. As illustrated in FIG. 12B, in the embodiment, the gap between shot regions is not provided, and the pressing region CPR is in contact with the pressing region NPR. A region CC in the drawing corresponds the gap C when the first mesa 111A is pressed on the pressing region CPR (FIG. 12A). That is, a photocurable resist in the region CC is not exposed since ultraviolet light is blocked by the light shielding area S2. Therefore, the photocurable resist in the region CC still has flowability. As illustrated in FIG. 12B, the photocurable resist in the region CC is irradiated with ultraviolet light through the terrace surface TN. That is, when the first mesa 111A is pressed on the pressing region NPR, but not the pressing region CPR, the photocurable resist is exposed and cured. As a result, a pressed photocurable resist area PSTR is formed between the resist patterns PP1 and PP2, as illustrated in FIG. 13. The photocurable resist area PSTR may be a dicing region, like the photocurable resist area STR in the second embodiment.

As described above, when the first mesa 111A is pressed on a region of the resist layer 12 and the resist layer 12 is irradiated with ultraviolet light, ultraviolet light is blocked by the light shielding area S2, and the resist is not cured. When the first mesa 111A is pressed on a subsequent region of the resist layer 12 and the resist layer 12 is again irradiated with ultraviolet light, the resist is exposed to light through the terrace surface TN of the second mesa 10B and cured. Like each of the embodiments, uncured areas that would otherwise be left after patterning processes do not need to be separately exposed, and thus throughput may be improved.

In an embodiment, the light shielding area S2 prevents irradiation of the photocurable resist below the terrace surface T with ultraviolet light since the light shielding area S2 is also provided on the terrace surface T of the second mesa 10B. Therefore, the photocurable resist below the terrace surface T is not cured, and its flowability can be maintained for later adjacent imprinting processes. Accordingly, when the first mesa 111A is pressed on a subsequent region, the resist layer 12 in the region is still easily deformed, and the recessed and protruding pattern on the lower surface of the first mesa 111A can be well transferred.

In the first mesa 111A, the gap C is provided outside the pattern region PA along two adjacent sides, and the light shielding area S2 extends to the gap C. The resist layer 12 is pressed not only by the pattern region PA but also by the light shielding area S2, and therefore the pressed photocurable resist area PSTR that can function as a dicing region is formed between the resist patterns PP1 and PP2. The photocurable imprint resist area PSTR corresponds to a so-called photocurable resist remaining film or a residual layer. The residual layer is removed prior to or during etching of a film-to-be-etched 14, and the film-to-be-etched 14 below the residual layer can be etched. Therefore, the film-to-be-etched 14 in the dicing region is removed or made thinner. Thus, a load or stress during dicing may be decreased.

In the embodiment, a gap between shot regions is not provided as seen from FIG. 12B. However, the gap is not restricted to this configuration. A predetermined gap (distance) between shot regions may be utilized. In this case, the photocurable imprint resist in the gap can be irradiated with ultraviolet light through the terrace surface TN of the second mesa 10B. Therefore, the requirement for another process of irradiation with ultraviolet light can still be eliminated.

Modification of Third Embodiment

Figure 14:
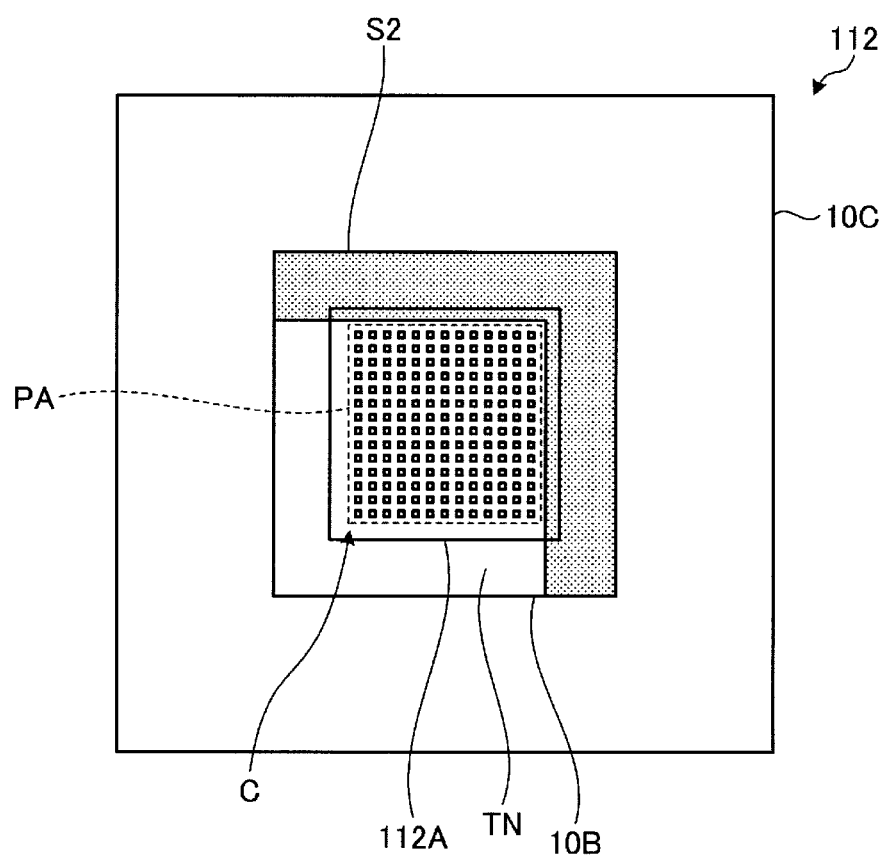
FIG. 14 is a view schematically illustrating a plan view of a template according to a modification of the third embodiment.

Next, a modification of the third embodiment will be described. A template according to the modification has the same configuration of the template 111 according to the third embodiment except that the first mesa differs from the first mesa 111A. As illustrated in FIG. 14, the gap C surrounds the pattern region PA at a first mesa 112A in a template 112 according to this modification of the third embodiment.

Figure 15A:
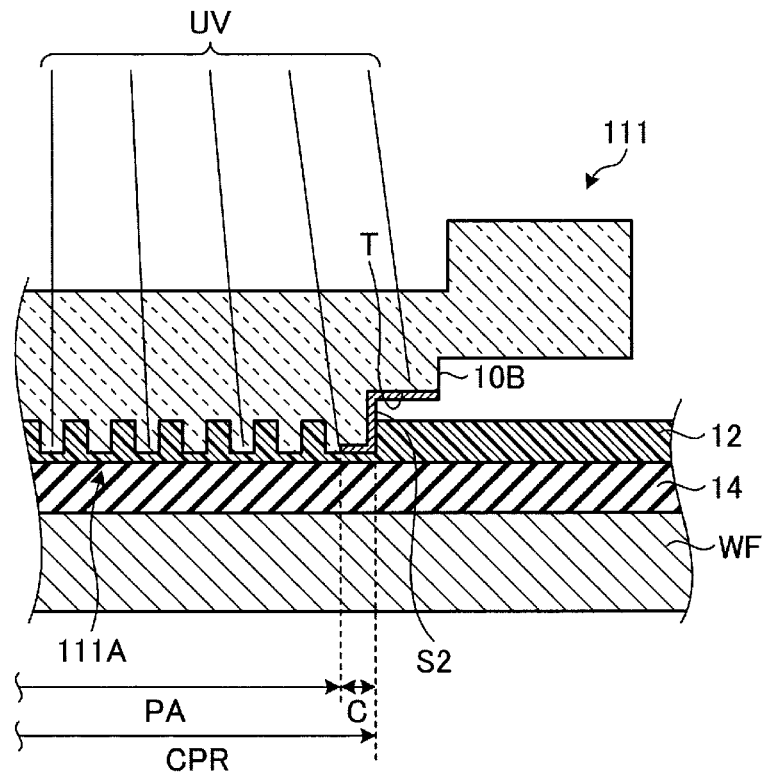
FIGS. 15A and 15B are views illustrating a patterning method using the template according to the modification of the third embodiment.

As illustrated in FIG. 15A, the first mesa 112A is pressed on the pressing region CPR of the resist layer 12, and the resist layer 12 is irradiated with ultraviolet light through the template 112. Also in this case, ultraviolet light is blocked by the light shielding area S2, like the third embodiment. A photocurable resist below the light shielding area S2 is not irradiated with ultraviolet light, and is not cured.

Figure 15B:
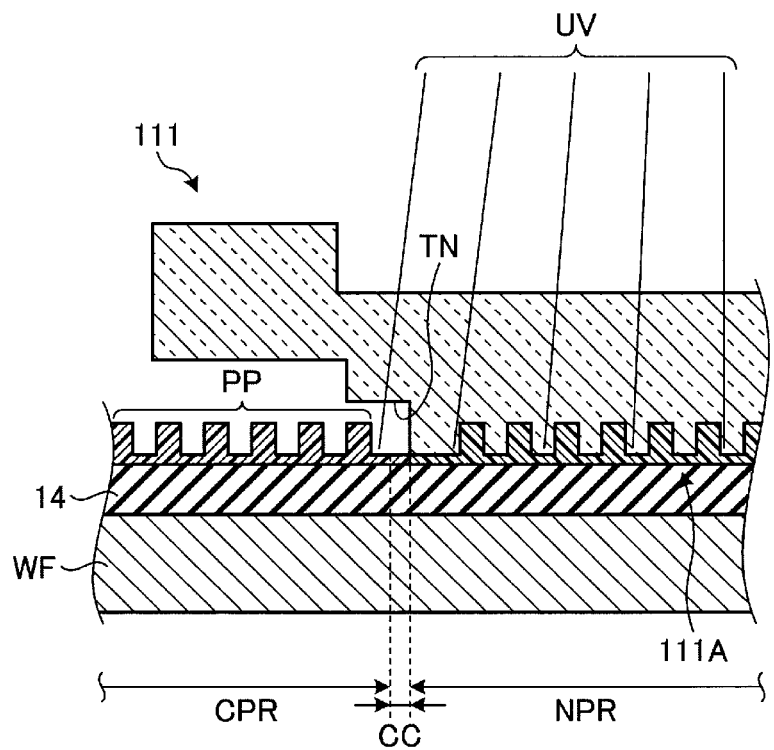

As illustrated in FIG. 15B, the first mesa 112A is pressed on the pressing region NPR of the resist layer 12, and the photocurable resist is irradiated with ultraviolet light through the template 112. At that time, the gap C of the first mesa 112A is in contact with the surface of the resist layer 12. As seen from FIG. 15A, the photocurable resist below the gap C corresponds to the photocurable resist that is pressed by the light shielding area S2 when the first mesa 112A is pressed on the pressing region CPR. That is, when the first mesa 112A is pressed on the pressing region NPR, the photocurable resist is not yet cured, and has flowability. When the first mesa 112A is pressed on the region NPR, the photocurable resist is then irradiated with ultraviolet light through the gap C, and the photocurable resist is cured. Thus, an initially uncured portion of the photocurable resist is cured. Thus, uncured areas of the photocurable resist need not be separately exposed, and throughput may be improved.

During pressing of the first mesa 112A on the pressing region NPR, photocurable resist outside the first mesa 112A (on a left side of the drawing) is cured by ultraviolet light while the first mesa 112A is pressed on the previous pressing region CPR. Therefore, the photocurable resist does not rise along the side wall surface of the first mesa 112A (in FIG. 15B, the left side wall surface of the first mesa 112A).

In this embodiment, two continuous pressing regions are overlapped at the gap C. That is, a gap between shot regions is not provided. Even in this case, a region where the gap C provided in the first mesa 112A is pressed can be used as a dicing region.

Figure 16:
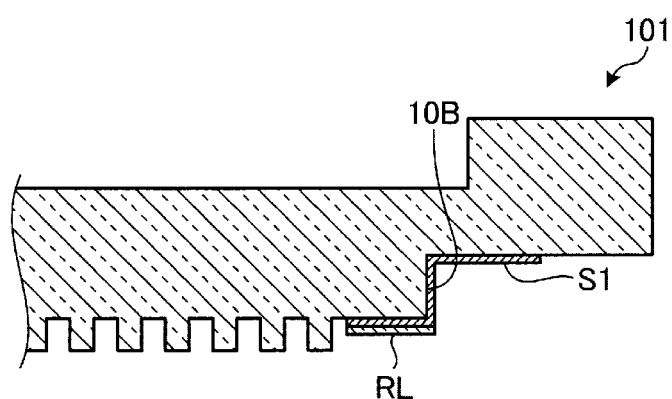
FIG. 16 is a partially enlarged view illustrating the template according to the modifications of the second and third embodiments.

Various modifications of the above examples are contemplated, such as the following. As illustrated in FIG. 16, for example, a release layer RL is desirably provided on a lower surface of the light shielding areas S1 and S2 of the second and third embodiments (a surface in contact with the resist layer 12). In these examples, when the first mesas 111A and 112A are pressed on the resist layer 12, the first mesas 111A and 112A are in contact with the surface of the resist layer 12. The light shielding areas S1 and S2 are formed from a metal such as Cr. When the first mesas are pressed on the resist layer 12, the lower surface of such light shielding areas S1 and S2 is in contact with the surface of the resist layer 12. Therefore, resist can be attached to the lower surface of the light shielding areas S1 and S2, and the lower surface thereof may be contaminated. The release layer RL that is provided on the lower surface of the light shielding areas S1 and S2 can reduce adhesion of the resist, and keep the lower surface clean. For example, the release layer RL may be formed from glass, diamond-like carbon, or the like. The release layer RL may be formed from a release agent. The release agent may be a surfactant containing fluorine and a silane-coupling agent.

In the aforementioned embodiments, the light shielding area S, S1, or S2 is formed by coating the terrace surface T with chromium (Cr). The metal to be used for such coatings is not restricted to Cr, and other materials such as tungsten (W), aluminum (Al), copper (Cu), or the like may be used. The light shielding area can prevent curing of a photocurable resist below the light shielding area depending on the thickness of the deposited material. The light shielding area may be formed so that the terrace surface T is a rough or roughened surface (unpolished surface). In this case, transmission of ultraviolet light can be decreased by scattering or the like rather than absorbance or reflection, and curing of the photocurable resist below the light shielding area can be prevented depending on the transmission amount of ultraviolet light.

The template according to any of the embodiments described above (including the modifications) and the patterning method using the template can be applied to a method for manufacturing a semiconductor device. For example, when a resist mask for forming a well in a silicon wafer, a wiring, a via hole, a memory hole, or the like of each layer is manufactured, the template and the patterning method using the template can be used.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. An imprint lithography template, comprising:
   a substrate transparent to ultraviolet light;
   a first mesa region on the substrate, a surface of the first mesa region including a pattern region to be pressed into a photocurable resist film, the pattern region having four sides;
   a second mesa region on the substrate, the first mesa region protruding from a surface of the second mesa region; and
   a blocking film adjacent to just two sides of the four sides pattern region, the two sides being connected to each other at a corner of the pattern region, the blocking film blocking the ultraviolet light.

2. The imprint lithography template according to claim 1, wherein the blocking film is on the surface of the first mesa.

3. The imprint lithography template according to claim 2, wherein the blocking film extends from the surface of the first mesa to the surface of the second mesa.

4. The imprint lithography template according to claim 3, wherein the blocking film is on a side surface of the first mesa.

5. The imprint lithography template according to claim 1, wherein the blocking film is on the surface of the second mesa.

6. The imprint lithography template according to claim 1, wherein the blocking film is recessed into the surface of the first mesa.

7. The imprint lithography template according to claim 1, wherein the blocking film comprises chromium.

8. The imprint lithography template according to claim 1, wherein the substrate is quartz.

9. The imprint lithography template according to claim 1, wherein the pattern region is square.

10. The imprint lithography template according to claim 1, wherein there is a gap between the sides of pattern region and the blocking film on the surface of the first mesa, the gap corresponding to a distance between die regions.

11. A template, comprising:
    a first mesa having a surface that includes a pattern region of recessed and protruding areas to be pressed on a resist layer, the first mesa having four sides;
    a first light transmission restriction region adjacent to the first mesa along a first side of the first mesa and a second side of the first mesa, the first and second sides meeting at a first corner region of the first mesa; and
    a first light transmission region adjacent to the first mesa along a third side of the first mesa and a fourth side of the first mesa, the third and fourth sides meeting a second corner region of the first mesa, wherein
    the first side is opposite the third side,
    the second side is opposite the fourth side, and
    the first light transmission restriction region transmits less exposure light than the first light transmission region when the exposure light is incident on the surface that includes the pattern region.

12. The template according to claim 11, further comprising:
    a second mesa, the first mesa being on a top surface of the second mesa, wherein
    the first light transmission restriction region extends on the top surface of second mesa on portions adjacent to first and second sides of the first mesa.

13. The template according to claim 12, further comprising:

a second light transmission restriction region on an edge surface of the first mesa adjacent to the first light transmission restriction region.

14. The template according to claim 12, wherein a difference in height between the first mesa and the second mesa is different on opposite sides of the first mesa.

15. The template according to claim 12, further comprising:
a third light transmission restriction region adjacent to the second mesa along the first light transmission restriction region.

16. The template according to claim 11, wherein the first light transmission restriction region includes a light blocking film thereon.

17. The template according to claim 16, wherein the light blocking film comprises chromium.

18. The template according to claim 11, wherein the first light transmission restriction region includes a release layer thereon.

19. A patterning method to transfer a pattern to a photocurable resist layer in a plurality of die regions of a substrate in sequence, the method comprising:
orienting a template according to claim 11 such that the first light transmission restriction region is on a front side of the first mesa matching a travel direction of the template between adjacent ones of the plurality of die regions aligned with each other in a first direction;
stepping the template along to the travel direction to individually press the oriented template on each of the plurality of die regions that are aligned with each other in the first direction and individually exposing each of these plurality of die regions to light through the template while pressing the template on each of these plurality of die regions;
after pressing the oriented template, in turn, on each of the plurality of die regions aligned in the first direction, shifting the template in a direction intersecting the first direction and in a reverse travel direction to position the oriented template in alignment with another plurality of die regions aligned in the first direction; and
stepping the template along to the travel direction to press the oriented template, in turn, on each of the other plurality of die regions that are aligned in the first direction and individually exposing each of these plurality of die regions to light through the template while pressing the template on each of these plurality of die regions.

20. The patterning method according to claim 19, wherein the substrate is a semiconductor wafer.

\* \* \* \* \*